United States Patent
Ozcan et al.

(10) Patent No.: US 8,030,154 B1
(45) Date of Patent: Oct. 4, 2011

(54) METHOD FOR FORMING A PROTECTION LAYER OVER METAL SEMICONDUCTOR CONTACT AND STRUCTURE FORMED THEREON

(75) Inventors: Ahmet S. Ozcan, Pleasantville, NY (US); Christian Lavoie, Ossining, NY (US); Zhen Zhang, Ossining, NY (US); Bin Yang, Ossining, NY (US)

(73) Assignees: International Business Machines Corporation, Armonk, NY (US); GLOBALFOUNDRIES, Inc., Grand Cayman (KY)

( * ) Notice: Subject to any disclaimer, the term of this patent is extended or adjusted under 35 U.S.C. 154(b) by 0 days.

(21) Appl. No.: 12/849,223

(22) Filed: Aug. 3, 2010

(51) Int. Cl.
*H01L 21/8238* (2006.01)

(52) U.S. Cl. ......... 438/230; 438/199; 438/581; 438/696

(58) Field of Classification Search .................. 438/199, 438/230, 581, 696
See application file for complete search history.

(56) References Cited

U.S. PATENT DOCUMENTS

| | | | |
|---|---|---|---|
| 776,695 A * | 12/1904 | Schwarz et al. | |
| 5,492,868 A | 2/1996 | Lin et al. | |
| 5,670,419 A | 9/1997 | Dixit et al. | |
| 6,177,334 B1 | 1/2001 | Chen et al. | |
| 6,187,674 B1 | 2/2001 | Chen et al. | |
| 6,228,735 B1 | 5/2001 | Lee | |
| 6,448,140 B1 | 9/2002 | Liaw | |
| 7,265,040 B2 | 9/2007 | Kim et al. | |
| 7,345,330 B2 | 3/2008 | Rhodes | |
| 7,399,663 B2 | 7/2008 | Hoentschel et al. | |
| 7,579,262 B2 * | 8/2009 | Hoentschel et al. | 438/478 |
| 7,585,735 B2 * | 9/2009 | Mathew et al. | |
| 7,601,635 B2 | 10/2009 | Yamada et al. | |
| 7,632,537 B2 | 12/2009 | Berryman | |
| 7,642,147 B1 * | 1/2010 | Kanakasabapathy | |
| 2006/0234455 A1 * | 10/2006 | Chen et al. | |
| 2007/0122966 A1 * | 5/2007 | Hoentschel et al. | |
| 2008/0076213 A1 * | 3/2008 | Hsieh et al. | |
| 2008/0090349 A1 * | 4/2008 | Hoentschel et al. | |
| 2008/0142871 A1 * | 6/2008 | Anezaki | |
| 2008/0242017 A1 * | 10/2008 | Lee et al. | |
| 2009/0001371 A1 * | 1/2009 | Mowry et al. | |
| 2010/0096673 A1 * | 4/2010 | Chen et al. | |
| 2011/0018072 A1 * | 1/2011 | Lin et al. | |
| 2011/0053366 A1 * | 3/2011 | Lee | |

* cited by examiner

*Primary Examiner* — Alexander Ghyka
(74) *Attorney, Agent, or Firm* — Scully, Scott, Murphy & Presser, P.C.; Yuanmin Cai

(57) ABSTRACT

In one embodiment, a method of forming a semiconductor device is provided that includes providing a gate structure on a semiconductor substrate. Sidewall spacers may be formed adjacent to the gate structure. A metal semiconductor alloy may be formed on the upper surface of the gate structure and on an exposed surface of the semiconductor substrate that is adjacent to the gate structure. An upper surface of the metal semiconductor alloy is converted to an oxygen-containing protective layer. The sidewall spacers are removed using an etch that is selective to the oxygen-containing protective layer. A strain-inducing layer is formed over the gate structure and the semiconductor surface, in which at least a portion of the strain-inducing layer is in direct contact with the sidewall surface of the gate structure. In another embodiment, the oxygen-containing protective layer of the metal semiconductor alloy is provided by a two stage annealing process.

23 Claims, 7 Drawing Sheets

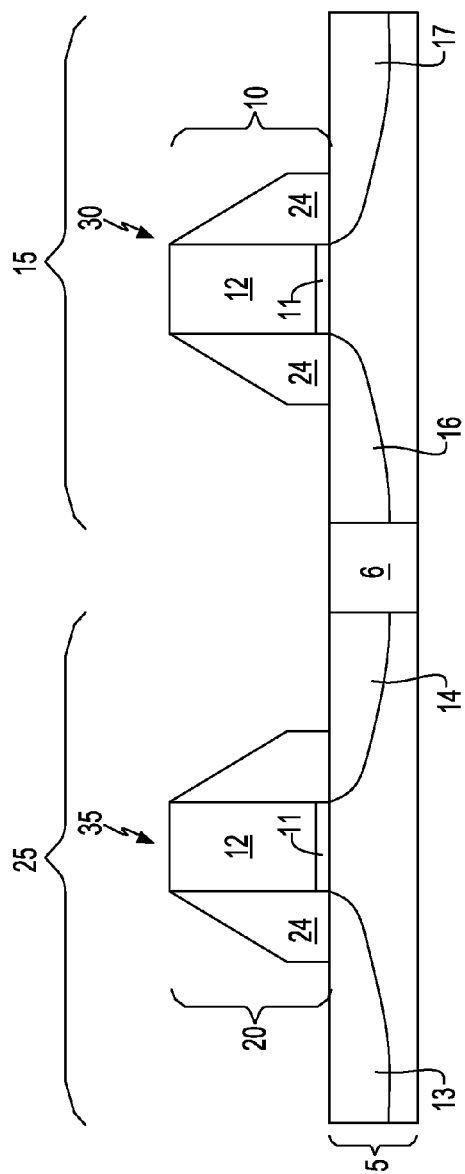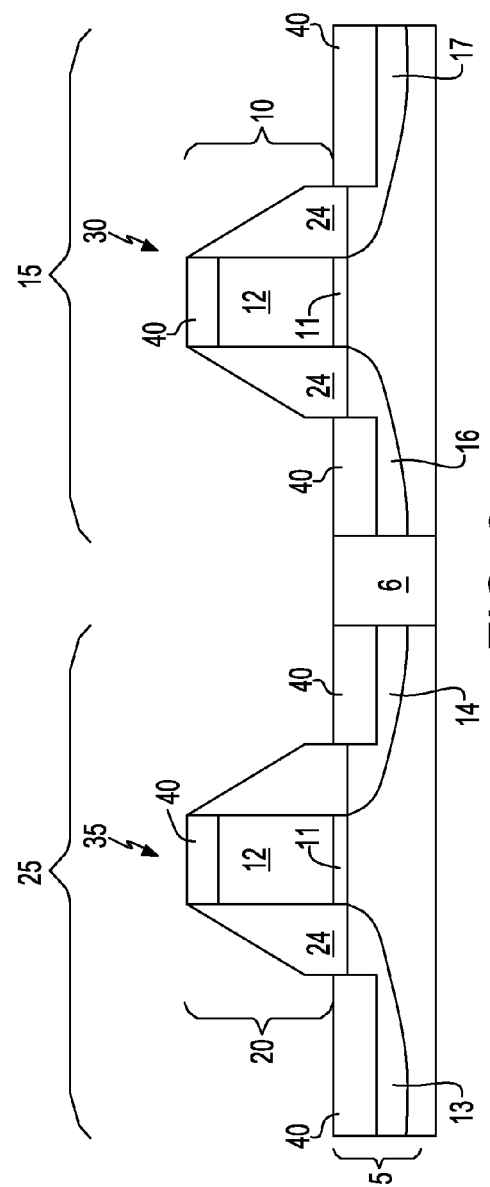

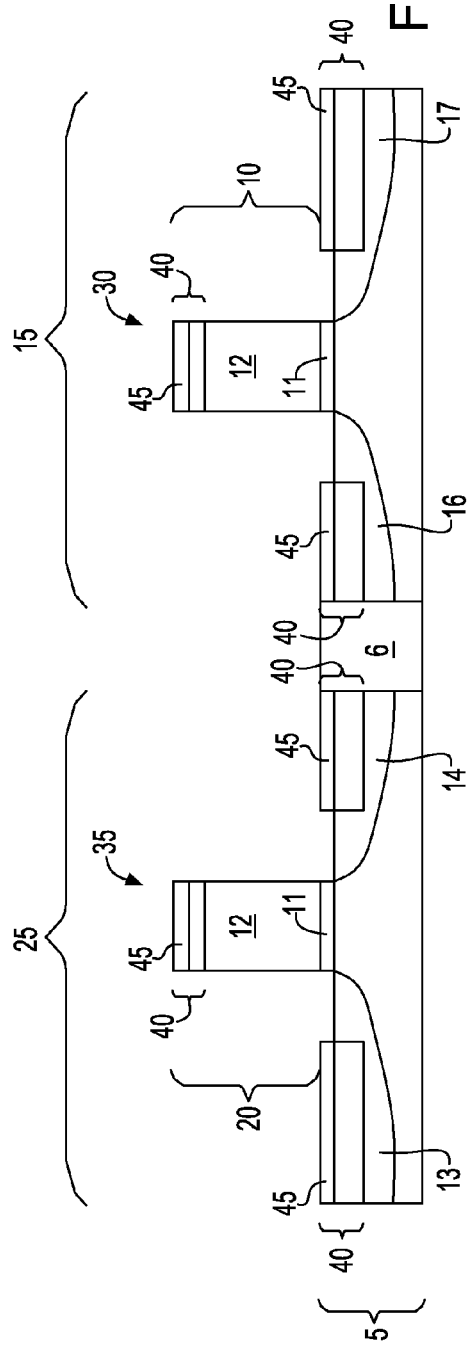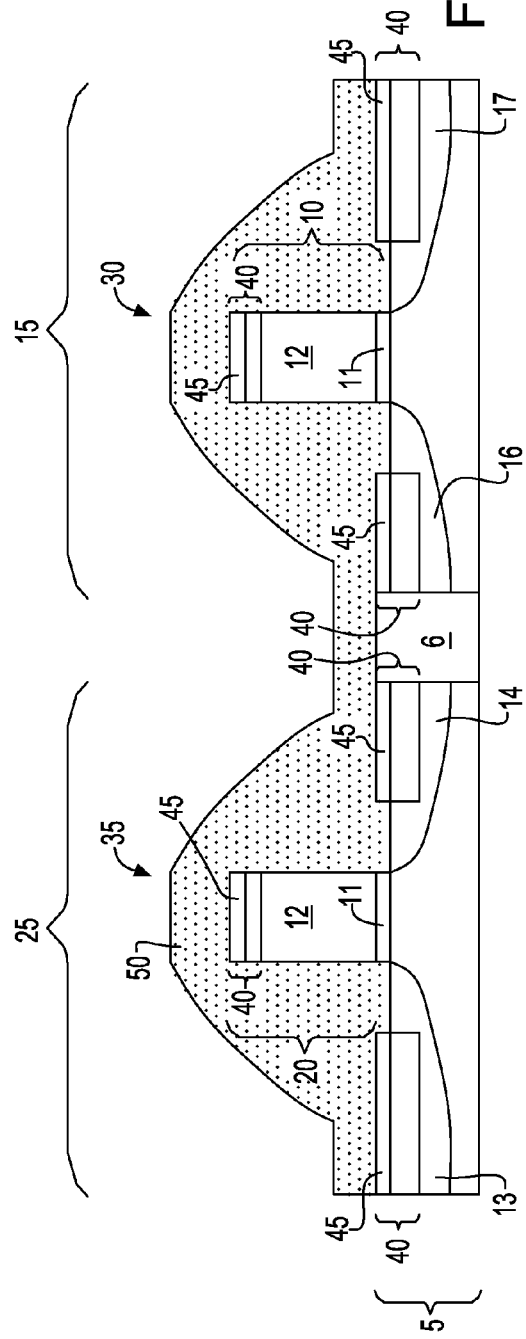

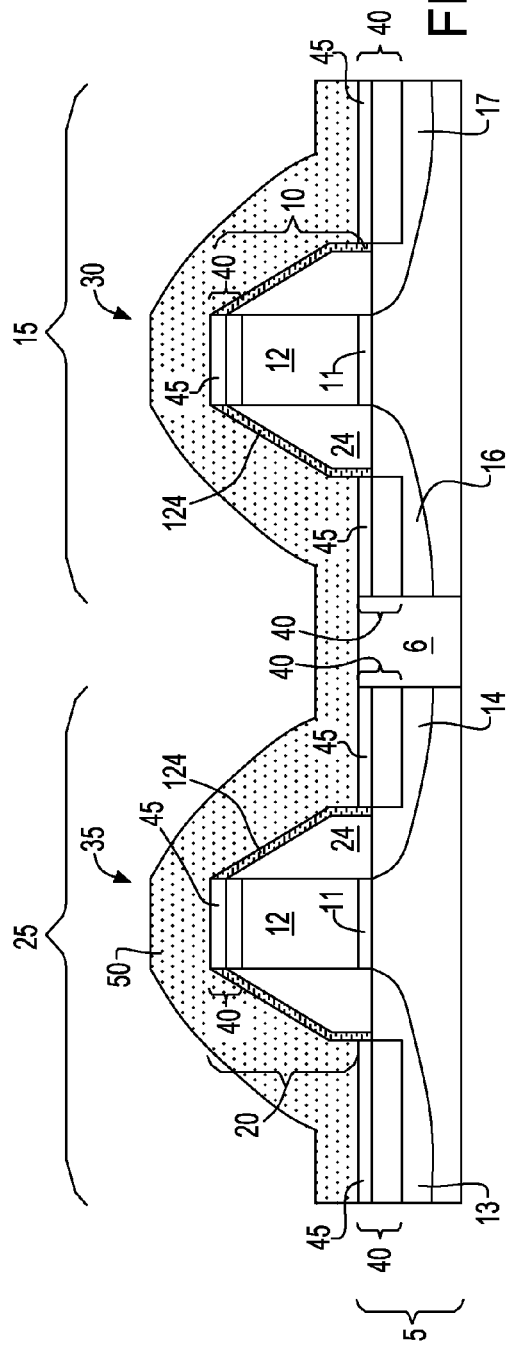

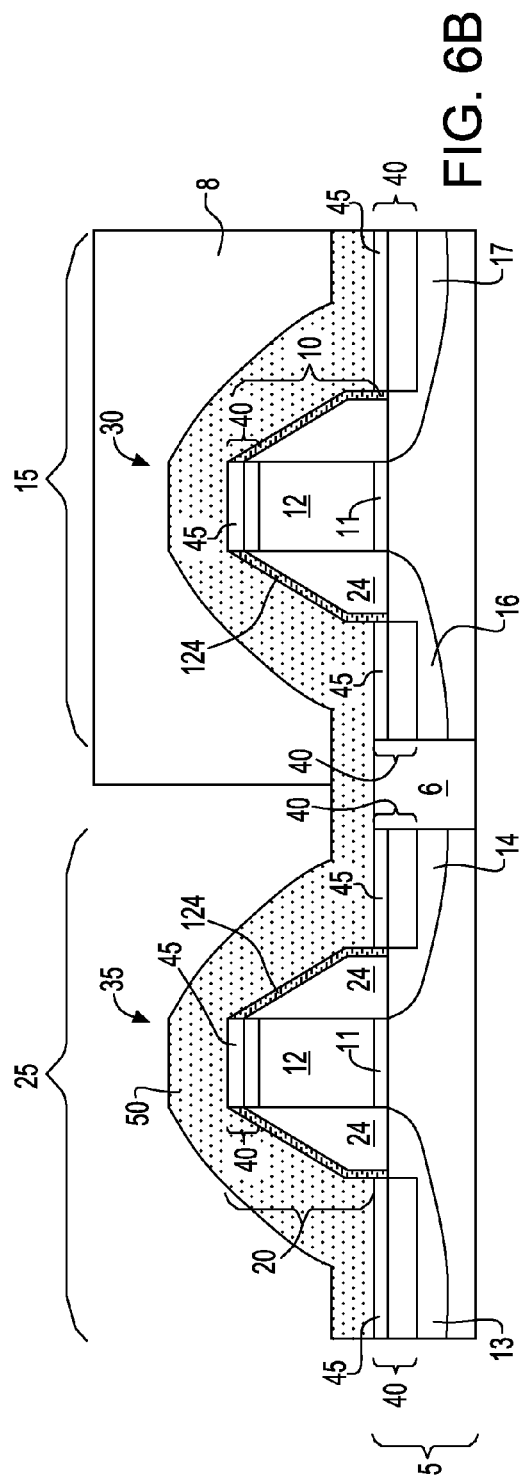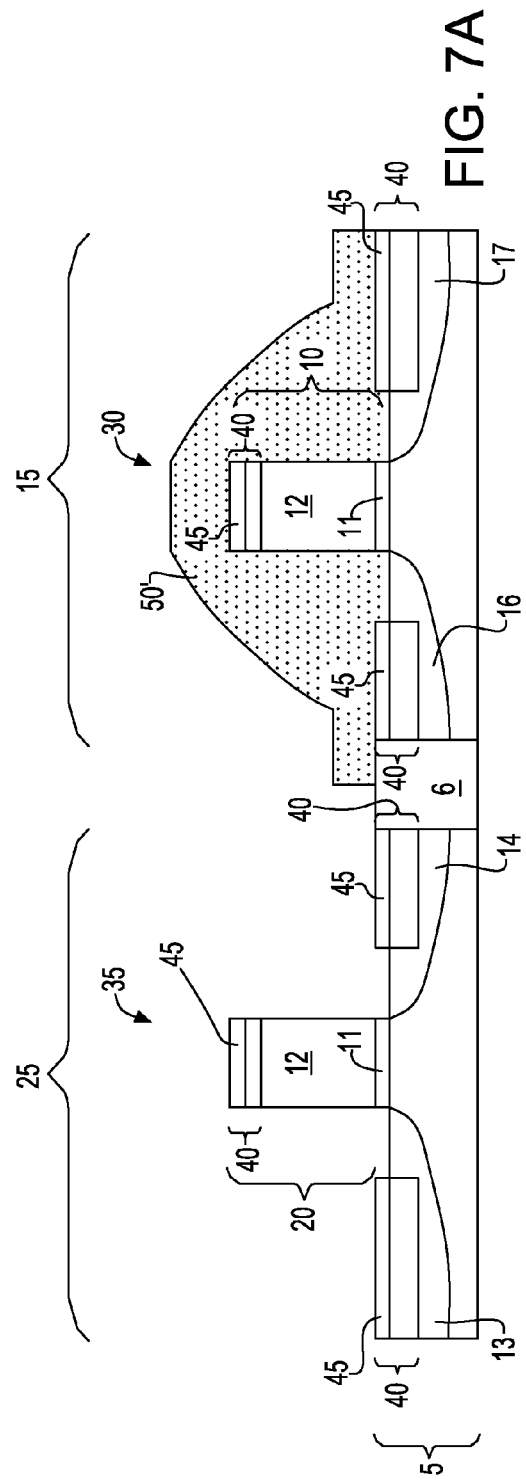

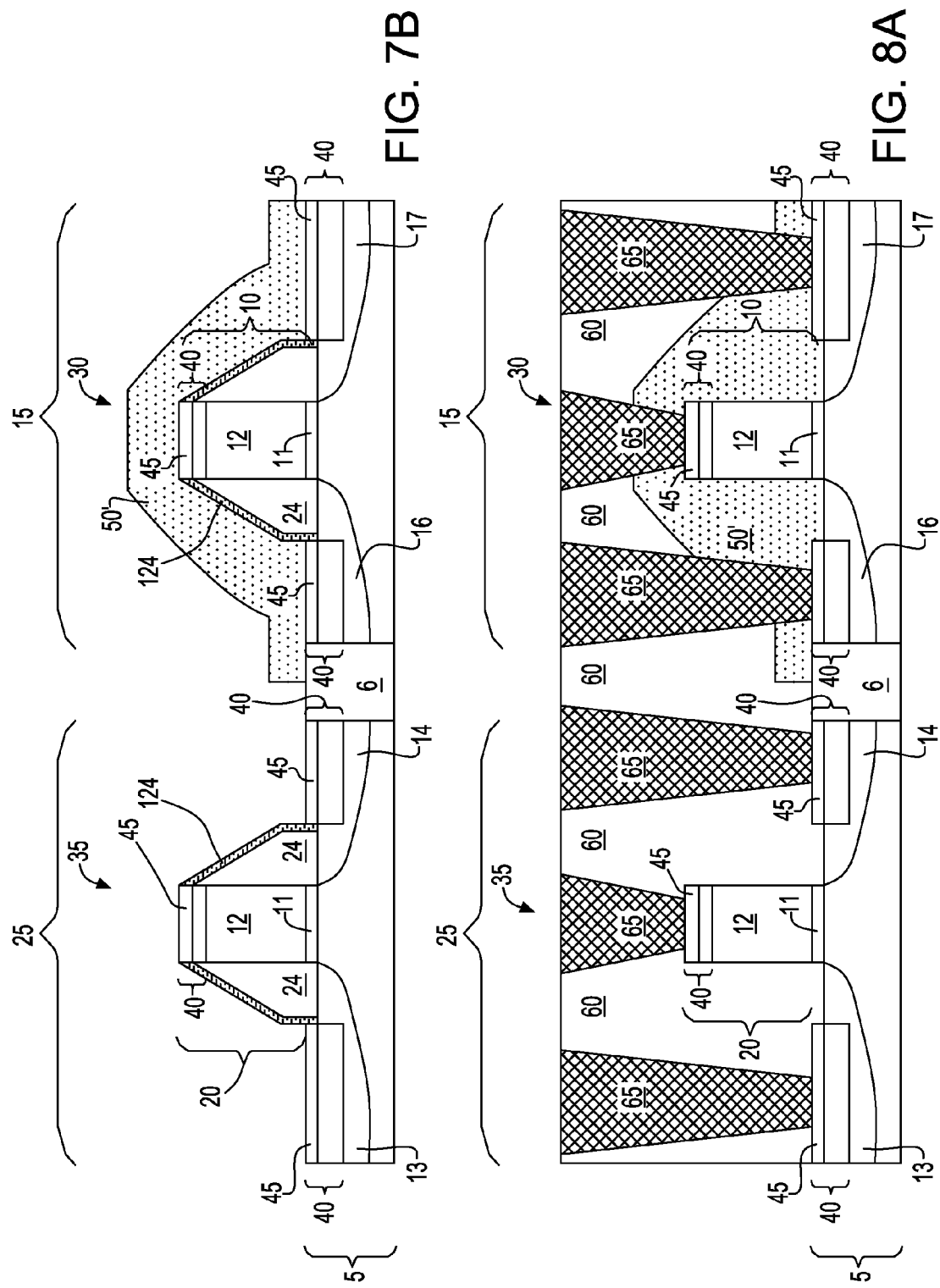

METHOD FOR FORMING A PROTECTION LAYER OVER METAL SEMICONDUCTOR CONTACT AND STRUCTURE FORMED THEREON

BACKGROUND

The present disclosure relates to semiconductor devices having increased electron and hole mobilities provided by strain-inducing materials, and selective etch methods for forming such semiconductor devices.

The continued miniaturization of silicon metal oxide semiconductor field effect transistors (MOSFETs) has driven the worldwide semiconductor industry. Various showstoppers to continued scaling have been predicated for decades, but a history of innovation has sustained Moore's Law in spite of many challenges. However, there are growing signs today that metal oxide semiconductor transistors are beginning to reach their traditional scaling limits. Since it has become increasingly difficult to improve MOSFETs and therefore complementary metal oxide semiconductor (CMOS) performance through continued scaling, methods for improving performance without scaling have become critical. One approach for doing this is to increase carrier (electron and/or hole) mobilities.

SUMMARY

A method of forming a semiconductor device is provided in which the metal semiconductor alloy regions, e.g., silicide regions, of the semiconductor device are protected from an etch process that removes the sidewalls spacers that are adjacent to a gate structure. The sidewalls spacers are removed prior to forming a strain-inducing layer over the gate structure and over the semiconductor substrate that the gate structure is present on. In one embodiment, the method includes providing a gate structure on a semiconductor substrate, and forming sidewall spacers adjacent to the gate structure. A metal semiconductor alloy is formed on at least one of the upper surface of the gate structure and the exposed surface of the semiconductor substrate that is adjacent to the gate structure. The upper surface of the metal semiconductor alloy is converted to an oxygen-containing protective layer. The sidewall spacers are removed using an etch that is selective to the oxygen-containing protective layer. A strain-inducing layer is formed over the gate structure and the semiconductor substrate, in which at least a portion of the strain-inducing layer is in direct contact with the sidewall surface of the gate structure.

In another aspect, a method of forming a semiconductor device is provided in which the metal semiconductor alloy regions, e.g., silicide regions, of the semiconductor device are protected from the etch process that removes the sidewalls spacers that are adjacent to the gate structure. The sidewalls spacers are removed prior to forming a strain-inducing layer over the gate structure and the semiconductor substrate that the gate structure is present on. In one embodiment, the method includes providing a gate structure including at least one gate conductor on a semiconductor substrate. Sidewall spacers may be formed adjacent to the gate structure. A metal semiconductor alloy region is formed on at least one of the upper surface of the gate structure and exposed portions of the semiconductor substrate using at least a two stage annealing process. The first stage of the annealing process for the metal semiconductor region produces a metal semiconductor layer that is in direct contact with the at least one gate conductor. The second stage of the annealing process for the metal semiconductor region forms an oxygen-containing protective layer on the metal semiconductor layer. The second stage of the annealing process includes an oxidizing ambient, wherein the first stage of the annealing process includes a substantially oxygen free ambient. The sidewall spacers are removed using an etch that is selective to the oxygen-containing protective layer. A strain-inducing layer is formed over the gate structure and the semiconductor substrate, in which at least a portion of the strain-inducing layer is in direct contact with the sidewall surface of the gate structure.

In another aspect, a method of forming a complementary metal oxide semiconductor (CMOS) device is provided. In one embodiment, the method includes providing a semiconductor substrate having a first gate structure in an n-type device region of the semiconductor substrate, and a second gate structure in a p-type device region of the semiconductor substrate. Metal semiconductor alloy regions are formed atop at least one of the first and second gate structures and portions of the semiconductor substrate adjacent to the first and second gate structures. An upper surface of each metal semiconductor alloy region is converted to an oxygen-containing protective layer. A strain-inducing layer is formed on the semiconductor substrate in the n-type device region, the semiconductor substrate in the p-type device region, and the first and second gate structures. The strain-inducing layer is removed from the p-type device region with an etch that is selective to the oxygen-containing protective layer.

In another aspect, a semiconductor device is provided including metal semiconductor alloy regions that include an oxygen-containing protective layer as the upper surface of the metal semiconductor alloy regions. In one embodiment, the edge of the oxygen-containing protective layer is aligned to the sidewall of the metal semiconductor alloy regions.

BRIEF DESCRIPTION OF THE DRAWINGS

The following detailed description, given by way of example and not intended to limit the invention solely thereto, will best be appreciated in conjunction with the accompanying drawings, wherein like reference numerals denote like elements and parts, in which:

FIG. 1 is a side cross-sectional view depicting forming a first gate structure in an n-type device region of a semiconductor substrate, forming a second gate structure in a p-type device region of the semiconductor substrate, forming a first set of sidewall spacers adjacent to the first gate structure, and forming a second set of sidewall spacers adjacent to the second gate structure, in accordance with one embodiment of the present disclosure.

FIG. 2 is a side cross-sectional view depicting forming a metal semiconductor alloy on the upper surface of the first and second gate structures and on exposed surfaces of the semiconductor substrate that are adjacent to the first and second gate structures, in accordance with one embodiment of the present invention.

FIG. 4 is a side cross-sectional view depicting removing the sidewall spacers using an etch that is selective to the oxygen-containing protective layer of the metal semiconductor alloy, in accordance with one embodiment of the present disclosure.

FIG. 5A is a side cross-sectional view depicting forming a first strain-inducing layer on the semiconductor substrate in the n-type and p-type device regions of the semiconductor substrate, including over the first and second gate structures, in which the sidewall spacers have been removed, in accordance with one embodiment of the present disclosure.

FIG. 5B is a side cross-sectional view depicting forming a first strain-inducing layer on the semiconductor substrate in the n-type and p-type device regions of the semiconductor substrate, including over the first and second gate structures and the sidewall spacers, in accordance with one embodiment of the present disclosure.

FIGS. 6A and 6B are a side cross-sectional views depicting forming a block mask protecting the n-type device region of the semiconductor substrate, in accordance with one embodiment of the present disclosure. FIG. 6A depicts one embodiment in which the sidewall spacers have been removed, whereas FIG. 6B depicts an embodiment in which the sidewall spacers remain.

FIG. 7A is a side cross-sectional view depicting removing the first strain-inducing layer from the p-type device region of the semiconductor substrate with an etch that is selective to the oxygen-containing protective layer and a block mask that is present over the n-type device region, in accordance with one embodiment of the present disclosure.

FIG. 7B is a side cross-sectional view depicting removing the first strain-inducing layer from the p-type device region of the semiconductor substrate with an etch that is selective to the oxygen-containing protective layer, the oxygen-containing surface of the sidewall spacer, and a block mask that is present over the n-type device region, in accordance with one embodiment of the present disclosure.

FIG. 8A is a side cross-sectional view depicting forming an interlevel dielectric over the structure depicted in FIG. 7A, and forming interconnects to the semiconductor devices that are present in the n-type device region and the p-type device region, in accordance with one embodiment of the present disclosure.

DETAILED DESCRIPTION OF THE INVENTION

Figure 3A:
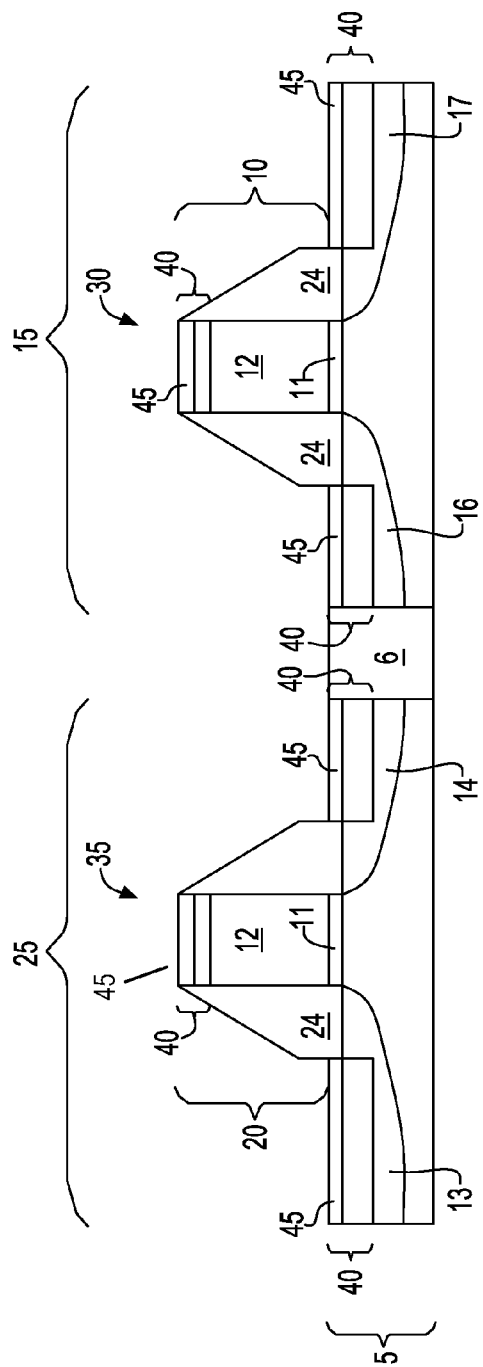
FIG. 3A is a side cross-sectional view depicting converting an upper surface of the metal semiconductor alloy to an oxygen-containing protective layer, in accordance with one embodiment of the present disclosure.

Detailed embodiments of the present disclosure are disclosed herein; however, it is to be understood that the disclosed embodiments are merely illustrative of the invention that may be embodied in various forms. In addition, each of the examples given in connection with the various embodiments of the disclosure are intended to be illustrative, and not restrictive. Further, the figures are not necessarily to scale, some features may be exaggerated to show details of particular components. Therefore, specific structural and functional details disclosed herein are not to be interpreted as limiting, but merely as a representative basis for teaching one skilled in the art to variously employ the present invention.

References in the specification to "one embodiment", "an embodiment", "an example embodiment", etc., indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, such as a first structure, is present on a second element, such as a second structure, wherein intervening elements, such as an interface structure, e.g. interface layer, may be present between the first element and the second element. The term "direct contact" means that a first element, such as a first structure, and a second element, such as a second structure, are connected without any intermediary conducting, insulating or semiconductor layers at the interface of the two elements.

The embodiments of the present disclosure relate to a method for forming a semiconductor device that includes forming a protection layer, e.g., oxygen-containing protective layer, over metal semiconductor alloy regions, e.g., silicide contacts. In one embodiment, the oxygen-containing protective layer protects the metal semiconductor alloy regions during the etch processes that removes the sidewall spacers that are adjacent to the gate structure before forming the strain-inducing layer over the gate structures to the semiconductor devices. In one embodiment, the strain-inducing material induces a strain on the channel region of the semiconductor device, wherein the strain increases electron mobility or hole mobility depending upon whether the strain is a tensile strain or a compressive strain. By removing the dielectric spacers from the sidewalls of the gate structure, the strain-inducing layer is brought closer to the channel region of the device, which increases the strain induced on the channel region of the semiconductor device. Typically, the etch that removes sidewall spacers that are comprised of silicon nitride damages the metal semiconductor alloy regions, e.g., silicide regions. In one embodiment, the method of the present disclosure provides an oxygen-containing protective layer on the upper surfaces of the metal semiconductor alloy regions, i.e., silicides, wherein the oxygen-containing protective layer protects the metal semiconductor alloy regions during etch processes that remove dielectric materials, such as dielectric spacers, interlevel dielectric layers, and dielectric strain-inducing layers. Although, the oxygen-containing protective layer is depicted in the figures as being formed on the metal semiconductor alloy regions that are present on both of the upper surface of the gate structure, and the surfaces of the semiconductor substrate that are adjacent to the gate structure, the present disclosure is not limited to this embodiment. For example, embodiments have been contemplated in which the oxygen-containing semiconductor alloy region is not present on the upper surface of the gate structure, but is present on the metal semiconductor alloy region that is present on the surfaces of the semiconductor substrate that are adjacent to the gate structure. In another embodiment, the oxygen-containing semiconductor alloy region is not present on the metal semiconductor alloy region that is present on the surfaces of the semiconductor substrate that are adjacent to the gate structure, but is present on the metal semiconductor alloy region that is on the upper surface of the gate structure.

FIG. 1 depicts the initial process steps for forming a semiconductor device in accordance with one embodiment of the present disclosure. A semiconductor device is an intrinsic semiconductor material that has been doped, i.e., into which a doping agent has been introduced, giving it different electrical properties than the intrinsic semiconductor. Doping involves adding dopant atoms to an intrinsic semiconductor, which changes the electron and hole carrier concentrations of the intrinsic semiconductor at thermal equilibrium. Dominant carrier concentration in an extrinsic semiconductor determines the conductivity type of the semiconductor. The conductivity type is either p-type, in which the majority charge carriers are holes, or n-type, in which the majority charge carriers are electrons.

In one embodiment, the semiconductor device provided by the present method is a field effect transistor (FET). A field effect transistor (FET) is a semiconductor device in which output current, i.e., source-drain current, is controlled by the voltage applied to a gate structure. A field effect transistor has three terminals, i.e., gate structure, source and drain. The gate structure is a structure used to control output current, i.e., flow of carriers in the channel, of a semiconducting device, such as a field effect transistor, through electrical or magnetic fields. The channel region is the region between the source and drain of the semiconductor device that becomes conductive when the semiconductor device is turned on. The source region is a doped region in the semiconductor device, in which majority carriers are flowing into the channel. The drain region is a doped region in semiconductor device located at the end of the channel region, in which carriers are flowing out of the semiconductor device through the drain region.

FIG. 1 depicts one embodiment of providing a semiconductor substrate 5 having a first gate structure 10 in an n-type device region 15 of a semiconductor substrate 5, and a second gate structure 20 in a p-type device region 25. In one embodiment, the semiconductor substrate 5 may be a bulk-semiconductor substrate, as depicted in FIG. 1. In one example, the bulk-semiconductor substrate may be a silicon-containing material. Illustrative examples of Si-containing materials suitable for the bulk-semiconductor substrate include, but are not limited to, Si, SiGe, SiGeC, SiC, polysilicon, i.e., polySi, epitaxial silicon, i.e., epi-Si, amorphous Si, i.e., α:Si, and multi-layers thereof. Although silicon is the predominantly used semiconductor material in wafer fabrication, alternative semiconductor materials can be employed, such as, but not limited to, germanium, gallium arsenide, gallium nitride, silicon germanium, cadmium telluride and zinc sellenide.

Although not depicted in FIG. 1, the semiconductor substrate 5 may also be a semiconductor on insulator (SOI) substrate. In the embodiments, in which the semiconductor substrate 5 is an SOI substrate, the semiconductor substrate 5 is typically composed of at least a first semiconductor layer overlying a dielectric layer, i.e., buried dielectric layer, e.g., buried oxide layer. A second semiconductor layer may be present underlying the dielectric layer. The first semiconductor layer and second semiconductor layer may comprise any semiconducting material including, but not limited to: Si, strained Si, SiC, SiGe, SiGeC, Si alloys, Ge, Ge alloys, GaAs, InAs, and InP, or any combination thereof. The dielectric layer that is present underlying the first semiconductor layer and atop the second semiconductor layer may be formed by implanting a high-energy dopant into the semiconductor substrate 5 and then annealing the structure to form a buried oxide layer. In another embodiment, the dielectric layer may be deposited or grown prior to the formation of the first semiconductor layer. In yet another embodiment, the semiconductor on insulator (SOI) substrate may be formed using wafer-bonding techniques, where a bonded wafer pair is formed utilizing glue, adhesive polymer, or direct bonding.

The semiconductor substrate 5 may include isolation regions 6, such as shallow trench isolation (STI) regions. The STI regions are formed by etching a trench in the semiconductor substrate 5 utilizing a dry etching process, such as reactive-ion etching (RIE) or plasma etching. The trenches may optionally be lined with a liner material, e.g., an oxide, and then chemical vapor deposition (CVD) or another like deposition process is used to fill the trench with oxide, nitride, polysilicon or another like STI dielectric material. The STI dielectric may optionally be densified after deposition. A planarization process, such as chemical-mechanical polishing (CMP), may be used to provide a planar structure.

The positioning of the isolation regions 6 typically defines the boundaries of the n-type device region 15 and the p-type device region 25. The n-type device region 15 may be processed to provide an n-type semiconductor device 30, and the p-type device region 25 may be processed to provide a p-type semiconductor device 35. The n-type device region 15 of the semiconductor substrate 5 may be doped with a p-type conductivity dopant, e.g., p-type well region. The p-type device region 25 of the semiconductor substrate 5 may be doped with an n-type conductivity dopant, n-type well region. P-type dopant refers to the addition of impurities to an intrinsic semiconductor that create deficiencies of valence electrons, such as boron, aluminum, gallium or indium to an intrinsic semiconductor surface comprised of silicon. N-type dopant refers to the addition of impurities that contribute free electrons to an intrinsic semiconductor, such as antimony, arsenic or phosphorous to a semiconducting surface comprised of silicon.

Still referring to FIG. 1, each of the first gate structure 10 and the second gate structure 20 include at least one gate dielectric 11 and at least one gate conductor 12. The first and second gate structures 10, 20 may be formed using deposition, photolithography and selective etch processes. A gate layer stack is formed on the semiconductor substrate 5 by depositing at least one gate dielectric layer 11 on the semiconductor substrate 5, and then by depositing at least one gate conductor layer 12 on the at least one gate dielectric layer 11.

The gate layer stack is then patterned and etched to provide the first and second gate structures 10, 20. Specifically, a pattern is produced by applying a photoresist to the surface to be etched, exposing the photoresist to a pattern of radiation, and then developing the pattern into the photoresist utilizing a resist developer. Once the patterning of the photoresist is completed, the sections covered by the photoresist are protected while the exposed regions are removed using a selective etching process that removes the unprotected regions.

In one embodiment, a hard mask (not shown) may be used to form the first and second gate structures 10, 20. The hard mask may be formed by first depositing a dielectric hard mask material, like SiN or $SiO_2$, atop a layer of gate conductor material and then applying a photoresist pattern to the hardmask material using a lithography process steps. The photoresist pattern is then transferred into the hard mask material using a dry etch process forming the hard mask. Next the photoresist pattern is removed and the hard mask pattern is transferred into the gate conductor material during a selective etching process, which etches the gate stack to provide the first and second gate structures 10, 20. Following etching the hard mask may be removed using a wet chemical strip, selective etching or oxygen ashing.

In one embodiment, the at least one gate dielectric 11 of the first and second gate structures 10, 20 may be an oxide, nitride and oxynitrides of silicon. In another embodiment, the at least one gate dielectric 11 may be composed of a high-k dielectric material. A high-k dielectric material has a dielectric constant that is greater than the dielectric constant of silicon oxide ($SiO_2$). In one embodiment, a high-k dielectric material has a dielectric constant that is greater than 4.0. High-k dielectric materials that are suitable for the at least one gate dielectric 11 may include, but are not limited to, hafnium oxides, hafnium silicates, titanium oxides, barium-strontium-titantates (BSTs) and lead-zirconate-titanates (PZTs). The at least one gate dielectric 11 of the first gate structure 10 may be composed of the same material or different material than the at least one gate dielectric 11 of the second gate structure 20.

The at least one gate dielectric 11 may be formed using any of several deposition and growth methods, including but not limited to, thermal or plasma oxidation or nitridation methods, chemical vapor deposition methods and physical vapor deposition methods. The at least one gate dielectric 11 of the first gate structure 10 may be composed of the same material or different material as the at least one gate dielectric 11 of the second gate structure. Although the at least one gate dielectric 11 is depicted in the supplied figures as being a single layer, embodiments are possible in which the at least one gate dielectric 11 of the first and second gate structures 10, 20 is a multi-layered structure of conductive materials. In one embodiment, the at least one gate dielectric 11 has a thickness ranging from 10 angstroms to 200 angstroms.

The at least one gate conductor 12 may be composed of at least one conductive materials including, but not limited to, metals, metal alloys, metal nitrides and metal silicides, as well as laminates thereof and composites thereof. In one embodiment, the at least one gate conductor 12 may be any conductive metal including, but not limited to, W, Ni, Ti, Mo, Ta, Cu, Pt, Ag, Au, Ru, Ir, Rh, and Re, and alloys that include at least one of the aforementioned conductive elemental metals. The at least one gate conductor 12 may also comprise doped polysilicon and/or polysilicon-germanium alloy materials (i.e., having a dopant concentration from 1E18 to 1E22 dopant atoms per cubic centimeter) and polycide materials (doped polysilicon/metal silicide stack materials). The at least one gate conductor 12 of the first gate structure 10 may be composed of the same material or different material than the at least one gate conductor 12 of the second gate structure 20. The at least one gate conductor 12 may be formed using a deposition method including, but not limited to, salicide methods, atomic layer deposition methods, chemical vapor deposition methods and physical vapor deposition methods, such as, but not limited to, evaporative methods and sputtering methods. Although the at least one gate conductor 12 is depicted in the supplied figures as each being a single layer, embodiments are possible in which the at least one gate conductor 12 is a multi-layered structure of conductive materials. The height of the at least one gate conductor 12 for each of the first and second gate structure 10, 20 may range from 15 nm to 50 nm. In one embodiment, the height of the at least one gate conductor 12 may range from 20 nm to 40 nm. In another embodiment, the height of the at least one gate conductor 12 may range from 25 nm to 35 nm. The first and second gate structures 10, 20 may also be formed using a replacement gate process.

Still referring to FIG. 1, the n-type device region 15 may be processed to provide an n-type field effect transistor (nFET) 30, i.e., n-channel field effect transistor, and the p-type device region 25 may be processed to provide a p-type field effect transistor (pFET) 35, i.e., p-channel field effect transistor. Source and drain regions including extension regions 13, 14, 16, 17 are positioned within the semiconductor substrate 5 and define a device channel. The source extension region 16 and drain extension region 17 of the nFET device 30 are n-type doped. The source extension region 13 and the drain extension region 14 of the pFET device 35 are p-type doped. N-type dopants in a Si-containing semiconductor substrate 5 are elements from Group V of the Periodic Table of Elements, such as As, Sb, and/or P. P-type dopants in a Si-containing semiconductor substrate 5 are elements from Group III of the Periodic Table of Elements, such as B. In one embodiment, the dopant for the source extension regions 13, 16 and the drain extension regions 14, 17 may be introduced to the semiconductor substrate 5 using ion implantation. Halo regions can also be formed beneath the source extension regions 13, 16 and the drain extension regions 14, 17 using an angled ion implantation and a dopant having a conductivity type opposite the source extension regions 13, 16 and the drain extension regions 14, 17.

In one embodiment, a higher energy ion implant is conducted to form deep source regions and deep drain regions (not shown). These implants are conducted at a higher energy and higher concentration of dopant than the implant that provides the source and drain extension regions 13, 14, 16, 17. The deep source regions and deep drain regions are typically doped with a dopant type consistent with the source extension regions 13, 16 and the drain extension regions 14, 17. Following deep source region and deep drain region formation, the dopant of the source and drain regions may be activated by activation annealing using conventional processes such as, but not limited to, rapid thermal annealing, furnace annealing, flash lamp annealing, flash lamp annealing, laser annealing or a combination thereof. Activation anneal is conducted at a temperature ranging from about 850° C. to about 1350° C. It is also possible to apply and activation anneal following each of the implant steps that provide the source and drain extension regions 13, 14, 16, 17, the halo regions, and/or the deep source and drain regions.

At least one sidewall spacer 24 may be employed to control the distance of the ion implant for the source and drain extension regions 13, 14, 16, 17 from the gate structures 10, 20. The at least one set of sidewall spacers 24 may be positioned adjacent to the first and second gate structures 10, 20, e.g., in direct contact with the sidewalls of the first and second gate structures 10, 20. In some embodiments, the width of the sidewall spacers 24 is selected to compensate for the lateral diffusion of the dopant for the source extension regions 13, 16 and drain extension regions 14, 17 during activation annealing.

Figure 3B:
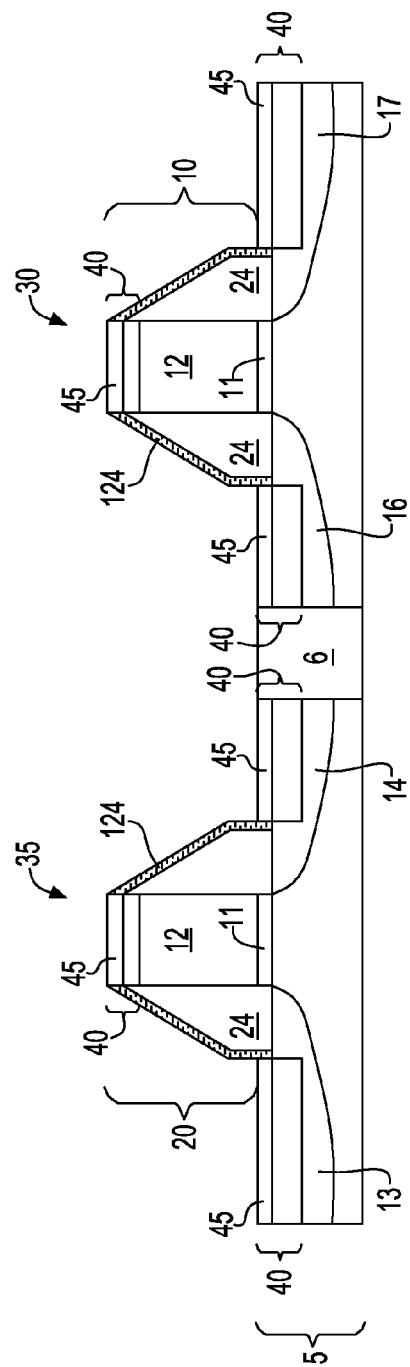
FIG. 3B is a side cross-sectional view of converting the upper surface of the metal semiconductor alloy to an oxygen-containing protective layer, in which an oxide-containing surface is formed on the exterior surface of a sidewall spacers composed of a nitride, in accordance with one embodiment of the present disclosure.

FIGS. 2, 3A and 3B depict one embodiment of forming a metal semiconductor alloy 40, in which an upper surface of the metal semiconductor alloy 40 includes an oxygen-containing protective layer 45. The term "metal semiconductor alloy" is a substance composed of two or more chemical elements of which at least one is a metal and another is a semiconductor. The metal semiconductor alloy is electrically conductive. In one embodiment, the electrical conductivity of the metal semiconductor alloy is greater than $10^{-8}$ $(\Omega\text{-m})^{-1}$ at room temperature.

FIG. 2 depicts an embodiment of forming a metal semiconductor alloy 40 on the upper surface of the first and second gate structures 10, 20, and on an exposed surfaces of the semiconductor substrate 5 that are adjacent to the first and second gate structures 10, 20. The upper surface of the first and second gate structures 10, 20, that the metal semiconductor alloy 40 is present on may be the upper surface of the at least one gate conductor 12. In one embodiment, metal semiconductor alloy 40 formation, such as silicide formation, typically requires depositing a metal onto the surface of a semiconductor material, such as a Si-containing material. In some examples, the composition of the metal being deposited for the metal semiconductor alloy 40 includes, but is not limited to, W, Ti, Ta, Pt, PdSi, Ni, Co, Er, V, Zr, Hf, Mo or Cr.

The metal layer that provides the metal semiconductor alloy 40 may be deposited using physical deposition methods, such as plating, electroplating, and sputtering. As used herein, "sputtering" means a method of depositing a film of metallic material, in which a target of the desired material, i.e., source, is bombarded with particles, e.g., ions, which knock atoms from the target, and the dislodged target material deposits on the deposition surface. Examples of sputtering apparatus that may be suitable for depositing the metal-containing layer include DC diode type systems, radio frequency (RF) sputtering, magnetron sputtering, and ionized metal plasma (IMP) sputtering. The metal layer may be deposited to a thickness ranging from 50 Å to 200 Å. In one embodiment, the metal layer is deposited to a thickness on the order of 70 Å.

Following deposition, the structure is subjected to an annealing step including, but not limited to, rapid thermal annealing. During annealing, the deposited metal reacts with the semiconductor material of the first and second gate structure 10, 20, e.g., at least one gate conductor 12 of the first and second gate structure 10, 20, and the semiconductor substrate 5 to form the metal semiconductor alloy 40. In one embodiment, in which the semiconductor substrate 5 and the at least one gate conductor 12 of the first and second gate structures 10, 20 are composed of silicon, the metal semiconductor alloy 40 is a metal silicide. In the embodiment, in which the deposited metal comprises Co, Er, V, Zr, Cu, Hf, Mo, Ni, or Cr, the metal semiconductor alloy 40 can be TaSi, PtSi, CoSi, $CoSi_2$, CuSi, $VSi_2$, ErSi, $ZrSi_2$, HfSi, $MoSi_2$, PdSi, NiSi, or $CrSi_2$. For $CoSi_2$, the first anneal is completed at a temperature ranging from 350° C. to 600° C. for a time period ranging from 1 second to 90 seconds. An optional second anneal may be employed to reduce the resistivity of the metal semiconductor alloy 40. In one example, the second anneal temperature ranges from 600° C. to 800° C., for a time period ranging from 1 second to 60 seconds. The second anneal can form a disilicide such as, $CoSi_2$. The non-reacted metal that is positioned on sidewall spacers 24 and the isolation region 6 is then stripped using a wet etch.

FIGS. 3A and 3B depict embodiments of converting an upper surface of the metal semiconductor alloy 40 to an oxygen-containing protective layer 45. By "converting" it is meant that the oxygen-containing protective layer 45 is composed of a semiconductor element and a metallic element from the metal semiconductor alloy 40. The oxygen element of the oxygen-containing protective layer 45 is provided by the conversion process step. In one embodiment, the conversion process step does not increase the metallic or semiconductor content of the metal semiconductor alloy 40.

The oxygen-containing protective layer 45 is typically comprised of 10% to 75% oxygen, 10% to 50% of at least one semiconductor element, and 0% to 25% of at least one metal element. In another embodiment, the oxygen containing protective layer 45 is typically comprised of 20% to 50% oxygen, 25% to 35% of at least one semiconductor element, and 5% to 20% of at least one metal element. In an even further embodiment, the oxygen containing protective layer 45 is typically comprised of 50% to 60% oxygen, 25% to 30% of at least one semiconductor element, and 10% to 25% of at least one metal element.

Some examples of composition of the oxygen-containing protective layer 45 include at least one of an oxide of nickel silicide, an oxide of platinum silicide, an oxide of cobalt silicide, an oxide of palladium silicide and combinations thereof. The thickness of the oxygen-containing protective layer 45 typically ranges from 5 Angstroms to 100 Angstroms. In another embodiment, the thickness of the oxygen-containing protective layer 45 typically ranges from 15 Angstroms to 50 Angstroms.

In one embodiment, the converting of the upper surface of the metal semiconductor alloy 40 into the oxygen-containing protective layer 45 comprises at least one of a thermal oxidation, a plasma oxidation, a rinse of a oxygenating species or a combination thereof. In one example, in which a thermal oxidation converts the upper surface of the metal semiconductor alloy region 40 into an oxygen-containing protective layer 45, the thermal anneal includes temperature greater than 400° C. in an atmosphere comprising 1% to 100% oxygen ($O_2$). In another example, the temperature ranges 450° C. to 600° C. in an atmosphere comprising 5% to 100% oxygen ($O_2$). The thermal anneal may be provided by a furnace anneal apparatus, flash lamp apparatus, rapid thermal anneal apparatus, or laser anneal. The time period of the thermal anneal may be selected to provide an oxygen-containing protective layer 45 having a thickness that ranges from 5 Angstroms to 100 Angstroms. In another embodiment, the time period of the thermal anneal may be selected to provide an oxygen-containing protective layer 45 having a thickness that ranges from 15 Angstroms to 50 Angstroms.

In one embodiment, in which a plasma oxidation converts the upper surface of the metal semiconductor alloy 40 into the oxygen-containing protective layer 45, the plasma oxidation comprises an oxygen-containing plasma, such as an ozone-containing plasma. The plasma may contain diatomic oxygen or monatomic oxygen, such as ozone. The oxygen content of the plasma may be as great as 100%. In one embodiment, the plasma is composed of 90% ozone (O) and 10% hydrogen ($H_2$), in which the temperature of the plasma may range from 25° (on the order of room temperature) to approximately 450° C. In another embodiment, the plasma is composed of 95% ozone (O) and 5% hydrogen ($H_2$), in which the temperature of the plasma may range from 25° C. (on the order of room temperature) to approximately 400° C. The time period of the plasma oxidation may be selected to provide an oxygen-containing protective layer 45 having a thickness that ranges from 5 Angstroms to 100 Angstroms. In another embodiment, the time period of the plasma oxidation may be selected to provide an oxygen-containing protective layer 45 having a thickness that ranges from 15 Angstroms to 50 Angstroms.

In one example, in which a wet clean (also referred to as "rinse") composed of deionized water and an ozone source converts the upper surface of the metal semiconductor alloy 40 into the oxygen-containing protective layer 45, the ozone source may be ozone generator which supplies ozone gas that is dissolved in the deionized water. The time period of the wet clean may be selected to provide an oxygen-containing protective layer 45 having a thickness that ranges from 5 Angstroms to 100 Angstroms. In another embodiment, the time period of the wet clean may be selected to provide an oxygen-containing protective layer 45 having a thickness that ranges from 15 Angstroms to 50 Angstroms.

In another embodiment, the oxygen-containing protective layer 45 is formed during the annealing process that intermixes the metal layer and the semiconductor material of the at least one gate conductor 12 that provides the metal semiconductor alloy 40. In one embodiment, the metal semiconductor region 40 is formed on an upper surface of the first and second gate structures 10, 20 and the exposed portions of the semiconductor substrate 5 using at least a two stage annealing process. The two stage annealing process may be provide by a furnace anneal, rapid thermal anneal, flash lamp annealing, laser anneal or a combination thereof.

The first stage of the annealing process produces the metal semiconductor layer 40 that is in direct contact with the at least one gate conductor 12 and the exposed portion of the semiconductor substrate 5. The first stage of the anneal is completed at a temperature ranging from 350° C. to 600° C. for a time period ranging from 1 second to 90 seconds. In the first stage of the anneal, the ambient is substantially oxygen free. By substantially oxygen free it is meant that the oxygen content of the ambient during the first stage is less than or equal to 0.9%. In some embodiments, the oxygen content of the ambient during the first stage is equal to 0%.

The second stage of the two stage annealing process forms a protective oxide region 45 on the metal semiconductor layer 40. During the second stage of the annealing process, an oxygen source is introduced to the anneal ambient, wherein the oxygen intermixes with the metal elements and the semiconductor elements of the at metal semiconductor alloy 40 to form the protective oxygen-containing layer 45 on the upper surface of the metal semiconductor alloy 40. In one example, the second stage of the two stage annealing process includes temperature greater than 400° C. in an atmosphere comprising 1% to 100% oxygen ($O_2$). In another example, the second stage of the two stage annealing process includes a temperature ranging from 450° C. to 600° C. in an atmosphere comprising 5% to 100% oxygen ($O_2$). The time period of the second stage of the thermal anneal may be selected to provide an oxygen-containing protective layer 45 having a thickness that ranges from 5 Angstroms to 100 Angstroms. In another embodiment, the second stage of the two stage annealing process continues for a time period that provides an oxygen-containing protective layer 45 having a thickness that ranges from 15 Angstroms to 50 Angstroms.

FIG. 3B depicts one embodiment of the present disclosure, in which the sidewall spacers 24 are composed of a nitride containing material, such as silicon nitride, and the process sequence that provides the oxygen-containing protective layer 45 also provides an oxygen-containing surface 124 on the exterior surfaces of the sidewall spacer 24. In some embodiments, the oxygen-containing surface 124 protects the nitride containing sidewalls spacers 24 from the etch compositions that remove selected portions of the subsequently formed nitride containing first and second strain-inducing layers.

In one embodiment, the oxygen-containing surface 124 is composed of silicon oxide ($SiO_2$). In another embodiment, the oxygen-containing surface 124 is composed of silicon oxynitride. Other compositions are suitable for the oxygen-containing surface 124 so long as the composition selected protects the nitride containing spacer 24 from etch processes used to remove the first and second strain-inducing layers. The oxygen-containing surface 124 may have a thickness that ranges from 5 Angstroms to 100 Angstroms. In another embodiment, the oxygen-containing surface 124 has a thickness that ranges from 15 Angstroms to 50 Angstroms.

FIG. 4 depicts one embodiment of removing the sidewall spacers 24 using a first etch that is selective to the oxygen-containing protective layer 45 of the metal semiconductor alloy 40. In one embodiment, by removing the sidewall spacers 24 prior to the formation of the subsequently formed strain-inducing layer, the strain-inducing layer is positioned in closer proximity to the sidewalls of the first and second gate structure 10, 20. Reducing the distance between the strain-inducing layer and the first and second gate structure 10, 20 increases the stress produced in the device channel of the semiconductor device that includes the first and second gate structures 10, 20.

The sidewall spacers 24 may be removed using a selective etching process that removes the sidewall spacers 24 without substantially etching the metal semiconductor alloy regions 40 that are present on the semiconductor substrate 5 or are present on the at least one gate conductor 12 of the first and second gate structure 10, 20. In one embodiment, the sidewall spacers 24 are removed by an etch process that is selective to the oxygen-containing protective layer 45 that is present atop the metal semiconductor alloy region 40. As used herein, the term "selective" in reference to a material removal process denotes that the rate of material removal for a first material is greater than the rate of removal for at least another material of the structure to which the material removal process is being applied. In one embodiment, the selective etch process may include an isotropic etch or an anisotropic etch.

An anisotropic etch process is a material removal process in which the etch rate in the direction normal to the surface to be etched is greater than in the direction parallel to the surface to be etched. The anisotropic etch may include reactive-ion etching (RIE). Reactive Ion Etching (RIE) is a form of plasma etching in which during etching the surface to be etched is placed on the RF powered electrode. Moreover, during RIE the surface to be etched takes on a potential that accelerates the etching species extracted from a plasma toward the surface, in which the chemical etching reaction is taking place in the direction normal to the surface. Other examples of anisotropic etching that can be used at this point of the present invention include ion beam etching, plasma etching or laser ablation. In contrast to anisotropic etching, isotropic etching is a form of etching that does not include a preferential direction. One example of an isotropic etch is wet etching. In one embodiment, in which the sidewall spacers 24 are composed of silicon nitride, and the oxygen-containing protective layer 45 are composed of silicon oxide, the sidewalls spacers 24 may be removed by an etch composed of phosphoric acid ($H_3PO_4$) at a temperature ranging from 100° C. to 180° C. The step of removing the sidewall spacer 24 may be omitted from some embodiments of the present disclosure.

FIGS. 5A and 5B depict forming a first strain-inducing layer 50 on the semiconductor substrate 5 in the n-type device region 15, the semiconductor substrate 5 in the p-type device region 25, and is formed over the first and second gate structures 10, 20. In the embodiment depicted in FIG. 5A, the sidewall spacers have been removed from the n-type device region 15 and the p-type device region 25, and the first strain-inducing layer 50 is formed in direct contact with the sidewalls of the first and second gate structures 10, 20. In the embodiment depicted in FIG. 5B, the sidewall spacers 24 are present, and the first strain-inducing layer 50 is formed in direct contact with the oxygen-containing surface 124 of the sidewall spacers 24.

The term "strain-inducing layer" means a layer that has a compressive or tensile intrinsic strain that transmits the compressive or tensile intrinsic strain to the channel of the device. In the embodiments, in which the first strain-inducing layer 50 provides a performance enhancement for p-type semiconductor devices, the strain-inducing layer 50 is a compressive strain-inducing layer. A "compressive strain-inducing layer" means that the material is under compaction, i.e., a decrease of volume. Consistent with the convention used to indicate compressive force a compressive strain is indicated by a positive sign ("+"). In the embodiments, in which the strain-inducing layer 50 provides a performance enhancement for n-type semiconductor devices, the strain-inducing layer 50 is a tensile strain-inducing layer. A "tensile strain-inducing layer" means the material is under expansion, i.e., an increase of volume. Consistent with the convention used to indicate negative force a negative strain is indicated by a negative sign ("−").

In the embodiment depicted in FIGS. 5A and 5B, the first strain-inducing layer 50 is formed overlying the n-type device region 15 and the p-type device region 25 of the semiconducting substrate 5. In one embodiment, forming the first strain-inducing layer 50 includes depositing a layer of silicon nitride that induces a tensile strain in the n-type semiconductor devices that are formed within n-type device region 15. In one embodiment, the first strain-inducing layer 50 is composed of $Si_3N_4$ that is deposited under conditions that produce an internal stress within the deposited layer.

The first strain-inducing layer 50 may be first blanket deposited atop the entire semiconductor substrate 5 including the n-type device region 15 and the p-type device region 25. The first strain-inducing layer 50 can be deposited using a low temperature chemical vapor deposition (CVD) process, such as plasma enhanced chemical vapor deposition (PECVD) or rapid thermal chemical vapor deposition (RTCVD). Modifying the process conditions used to deposit the first strain-inducing layer 50 can control whether the state of stress is tensile or compressive.

Plasma enhanced chemical vapor deposition (PECVD) can provide strained dielectrics having a compressive or tensile internal stress. The stress state of the strained dielectric layer deposited by PECVD can be controlled by changing the deposition conditions to alter the reaction rate within the deposition chamber. More specifically, the stress state of the deposited strained dielectric layer may be set by changing the deposition conditions such as: $SiH_4/N_2$/He gas flow rate, pressure, RF power, and electrode gap.

Rapid thermal chemical vapor deposition (RTCVD) can provide a first strain-inducing layer 50 having an internal tensile stress. The magnitude of the internal tensile stress produced within the first strain-inducing layer 50 deposited by RTCVD can be controlled by changing the deposition conditions. More specifically, the magnitude of the tensile stress within the deposited first strain-inducing layer 50 may be set by changing deposition conditions such as: precursor composition, precursor flow rate and temperature.

In one embodiment, the first strain-inducing layer 50 can be $Si_3N_4$ deposited by PECVD under conditions to produce a tensile strained first strain-inducing layer 50. The deposition conditions may include a low frequency power ranges from 0 W to 100 W, a high frequency power that ranges from 200 to 600 W, a silane flow rate that ranges from 50 sccm to 200 sccm, an $NH_3$ flow rate that ranges from 1,500 sccm to 3,000 sccm, and a deposition pressure of 15 Torr or less. In one embodiment, the first strain-inducing layer 50 produces a longitudinal stress on the device channel of the n-type semiconductor devices, e.g., n-type field effect transistors (nFET) 30, within the n-type device region 15 ranging from 200 MPa to 2000 MPa.

Referring to FIGS. 6A, 6B, 7A and 7B, in some embodiments, the portion of the first strain-inducing layer 50 that is overlying the p-type device region 25 is removed, wherein a remaining portion of the first strain-inducing layer 50' is present overlying the n-type device region 15. FIGS. 6A and 6B depict forming a block mask 8 protecting the portion of the first strain-inducing layer 50 that is present over the n-type device region 15 of the semiconductor substrate 5. In one embodiment, the block mask 8 is a photoresist mask.

Referring to FIGS. 6A and 6B, a block mask 8, e.g., photoresist mask, may be formed overlying, e.g., in direct contact with, the first strain-inducing layer 50 in the n-type device region 15 of the semiconducting substrate 5. In one embodiment, a photoresist mask is formed using deposition, photolithography and etch processes. The photoresist mask is provided by a blanket layer of photoresist material that is deposited on the surface of the first strain-inducing layer 50 utilizing a deposition process, such as, e.g., CVD, PECVD, evaporation or spin-on coating. The blanket layer of photoresist material can be patterned into a photoresist mask by utilizing a lithographic process that may include exposing the photoresist material to a pattern of radiation and developing the exposed photoresist material utilizing a resist developer.

Referring to FIGS. 7A and 7B, in some embodiments, with the block mask 8 in place, the exposed portion of the first strain-inducing layer 50 is removed utilizing one or more etching processes, such as an anisotropic etch process, wherein the portion of the first strain-inducing layer 50 that is removed exposes the structures, e.g., p-type field effect transistors (pFET) 35, in the p-type device region 25. As used herein, an anisotropic etch process denotes a material removal process in which the etch rate in the direction normal to the surface to be etched is much higher than in the direction parallel to the surface to be etched. In one embodiment, the one or more etching processes may include dry etching or wet etching. In one embodiment, reactive-ion etching (RIE) is used. Reactive Ion Etching (RIE) is a form of plasma etching in which during etching the surface to be etched is placed on the RF powered electrode, wherein the surface to be etched takes on a potential that accelerates the etching species extracted from a plasma toward the surface, in which the chemical etching reaction is taking place in the direction normal to the surface. Other examples of dry etching that can be used at this point of the present invention include ion beam etching, plasma etching or laser ablation.

FIGS. 7A and 7B depict embodiments of removing the first strain-inducing layer 50 from the p-type device region 25 of the semiconductor substrate 5 with a second etch that is selective to the oxygen-containing protective layer 45 and the block mask 8. In one embodiment, following the second etch, a remaining portion of the first strain-inducing layer 50' is present in the n-type device region 15 underlying the block mask 8. In one embodiment, the second etch is an anisotropic, such as reactive ion etch, or isotropic etch. In one embodiment, the second etch that removes the exposed portion of the first strain-inducing layer 50 selective to the block mask 8. The second etch may also be selective to the oxygen-containing protective layer 45 of the metal semiconductor alloy 40 that is present on the second gate structure 20 in the p-type device region 25. The second etch may also be selective to the oxygen-containing protective layer 45 of the metal semiconductor alloy 40 that is present on the surfaces of the semiconductor substrate 5 that are on opposing sides of the second gate structure 20 in the p-type device region 25. In one embodiment, in which the first strain-inducing layer 50 is composed of silicon nitride, and the oxygen-containing protective layer 45 is composed of silicon oxide, and the block mask 8 is composed of a photoresist, the exposed portion of the first strain-inducing layer 50 may be removed by a florine based etch, such as $CF_4$ or $CH_2F_2$. The block mask 8 may be removed from the n-type device region 15 using a chemical strip, selective etch or oxygen ashing.

FIG. 7B depicts removing the first strain-inducing layer 50 from the p-type device region 25 of the semiconductor substrate 5 with an etch that is selective to the oxygen-containing protective layer 45, the oxygen-containing surface 124 of the sidewall spacer 24, and the block mask 8 that is present over the n-type device region 15. In this embodiment, the oxygen-containing surface 124 protects the nitride-containing sidewall spacer 24 from the etch that removes the first strain-inducing layer 50. In one embodiment, in which the first strain-inducing layer 50 is composed of silicon nitride, and the oxygen-containing protective layer 45 is composed of silicon oxide, the oxygen-containing surface 124 of the sidewall spacer 24 is composed of silicon oxide, and the block mask 8 is composed of a photoresist, the exposed portion of the first strain-inducing layer 50 may be removed by a florine based etch, such as $CF_4$ or $CH_2F_2$. The block mask 8 may be removed from the n-type device region 15 using a chemical strip, selective etch or oxygen ashing.

Figure 8B:
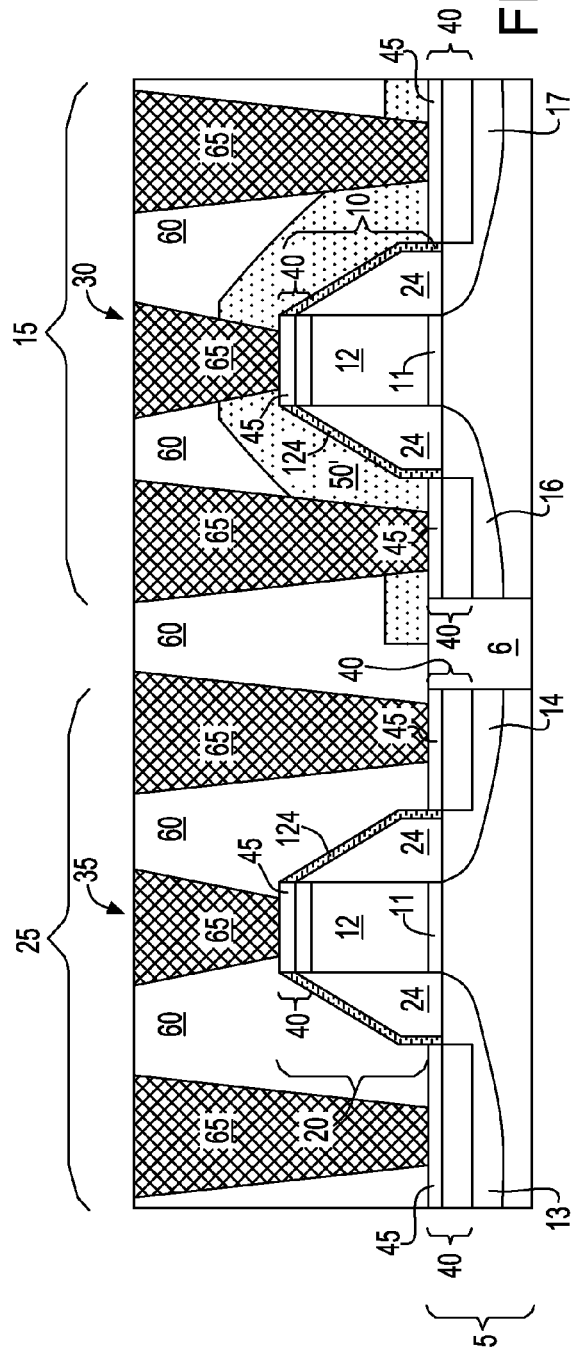
FIG. 8B is a side cross-sectional view depicting forming an interlevel dielectric over the structure depicted in FIG. 7B, and forming interconnects to the semiconductor devices that are present in the n-type device region and the p-type device region, in accordance with one embodiment of the present disclosure.

FIGS. 8A and 8B depict embodiments of a final structure formed from the method depicted in FIGS. 1-7B. In this embodiment, an interlevel dielectric 60 is formed over the structure depicted in FIGS. 7A and 7B, and interconnects 65 are formed through the interlevel dielectric 60 to the p-type and n-type semiconductor devices 30, 35 that are present in the n-type device region 15 and the p-type device region 25. In one embodiment, an interlevel dielectric 60 is blanket deposited atop the entire semiconductor substrate 5 and planarized. The interlevel dielectric 60 may be selected from the group consisting of silicon-containing materials such as $SiO_2$, $Si_3N_4$, $SiO_xN_y$, SiC, SiCO, SiCOH, and SiCH compounds; the above-mentioned silicon-containing materials with some or all of the Si replaced by Ge; carbon-doped oxides; inorganic oxides; inorganic polymers; hybrid polymers; organic polymers such as polyamides or SiLK™; other carbon-containing materials; organo-inorganic materials such as spin-on glasses and silsesquioxane-based materials; and diamond-like carbon (DLC, also known as amorphous hydrogenated carbon, α-C:H). Additional choices for the interlevel dielectric 60 include: any of the aforementioned materials in porous form, or in a form that changes during processing to, or from being porous and/or permeable to being non-porous and/or non-permeable. The interlevel dielectric 60 may be formed by various methods well known to those skilled in the art, including, but not limited to: spinning from solution, spraying from solution, chemical vapor deposition (CVD), plasma enhanced CVD (PECVD), sputter deposition, reactive sputter deposition, ion-beam deposition, and evaporation.

The deposited interlevel dielectric 60 may then patterned and etched to form via holes to the various source/drain and gate conductor regions of the p-type and n-type semiconductor devices 30, 35. In some embodiments, the oxygen-containing protective layer 45 remains on the source/drain and gate conductor regions of the p-type and n-type semiconductor devices 30, 35, but in some other embodiments the contact etch can go through the oxygen-containing protective layer 45 to provide a good contact to the underlying metal semiconductor alloy, e.g., silicide. Following via formation interconnects 65 are formed by depositing a conductive metal into the via holes using conventional processing, such as CVD or plating. The conductive metal may include, but is not limited to: tungsten, copper, aluminum, silver, gold, and alloys thereof.

Figure 9:
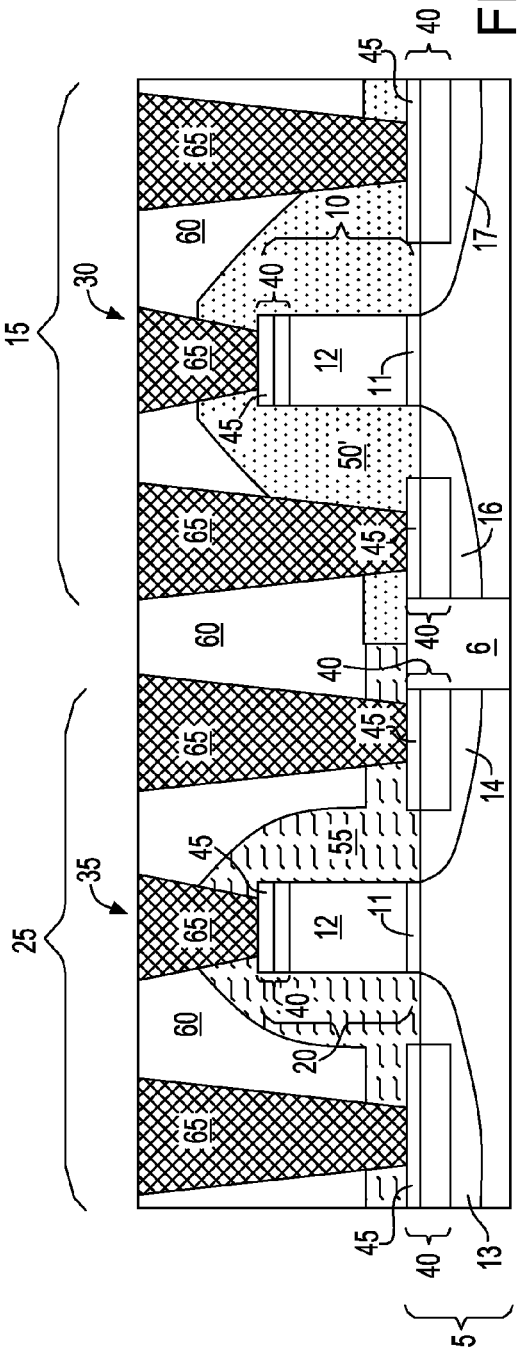
FIG. 9 is a side cross-sectional view depicting forming a second strain-inducing layer over the p-type device region of the semiconductor substrate and forming interconnects to the semiconductor devices that are present in the n-type device region and the p-type device region, in accordance with one embodiment of the present disclosure.

FIG. 9 depicts another embodiment of a final structure formed from the method depicted in FIGS. 1-7B. FIG. 9 depicts one embodiment of forming a second strain-inducing layer 55 over the p-type device region 25 of the semiconductor substrate 5. The second strain-inducing layer 55 may be a compressive strain-inducing layer. Similar to the first strain-inducing layer 50, the second strain-inducing layer 55 may be blanket deposited atop the p-type device region 25 and the n-type device region 15 of the semiconducting substrate 5. The second strain-inducing layer 55 may be in direct contact with the remaining portion of the first strain-inducing layer 50' in the n-type device region 15 of the semiconductor substrate 5.

In the embodiment, the second strain-inducing layer 55 is deposited under conditions to produce a compressively strained dielectric layer. The second strain-inducing layer 55 can be deposited using a low temperature chemical vapor deposition (CVD) process, such as plasma enhanced chemical vapor deposition (PECVD) or rapid thermal chemical vapor deposition (RTCVD). In one embodiment, a compressively strained second strain-inducing layer 55 can be produced using PECVD of $Si_3N_4$, in which the deposition conditions include a low frequency power ranging from 500 to 1,500 W, a high frequency power ranging from 250 W to 500 W, a silane flow rate ranging from 800 sccm to 2,000 sccm, an $NH_3$ flow rate ranging from 6,000 sccm to 10,000 sccm, and a deposition pressure of 10 Torr or less. The compressively strained second strain-inducing layer 55 can be deposited to a thickness ranging from 500 Å to 1500 Å. In another embodiment, the compressively strained second strain-inducing layer 55 may have a thickness ranging from 500 Å to 1000 Å. In one embodiment, the compressive strained second strain-inducing layer 55 produces a compressive longitudinal stress on the device channel of the p-type semiconductor devices 35 within the p-type device region 25 ranging from 200 MPa to 2000 MPa.

In one embodiment, following the blanket deposition, the second strain-inducing layer 55 is removed from the n-type device region 15 of the semiconductor substrate 5 using photolithography and etch processes similar to those described above with reference to FIGS. 6 and 7 for removing the portion of the first strain-inducing layer that was overlying the p-type device region 25. In one embodiment, an interlevel dielectric 60' is formed over the n-type field effect transistors (nFET) 30 and the p-type field effect transistors (pFET) 35, and interconnects 65' are formed through the interlevel dielectric 60' to the p-type and n-type semiconductor devices 30, 35 that are present in the n-type device region 15 and the p-type device region 25. The interlevel dielectric 60' and the interconnects 65' depicted in FIG. 9 are similar in composition and method of manufacture as the interlevel dielectric 60 and the interconnects 65 that are depicted in FIGS. 8A and 8B.

While this invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. A method of forming a semiconductor device comprising:
   providing a gate structure on a semiconductor substrate;
   forming sidewall spacers adjacent to the gate structure;
   forming a metal semiconductor alloy on at least one of an upper surface of the gate structure and an exposed surface of the semiconductor substrate that is adjacent to the gate structure;
   converting an upper surface of the metal semiconductor alloy to an oxygen-containing protective layer;
   removing the sidewall spacers using an etch that is selective to the oxygen-containing protective layer; and forming a strain-inducing layer over the gate structure and the semiconductor surface, wherein at least a portion of the strain-inducing layer is in direct contact with the sidewall surface of the gate structure.

2. The method of claim 1, wherein the providing of the gate structure comprises forming at least one gate dielectric layer on the semiconductor surface, forming at least one gate conductor layer on the at least one gate dielectric layer to provide a gate stack; forming a photoresist mask on a portion of the gate stack; and etching the gate stack selective to the photoresist mask.

3. The method of claim 1, further comprising forming a source region and a drain region in the semiconductor substrate adjacent a portion of the semiconductor substrate that the gate structure is present on.

4. The method of claim 1, wherein the forming of the sidewall spacers comprises depositing the dielectric material layer on the gate structure and the semiconductor substrate, and etching the dielectric material layer so that a remaining portion of the dielectric material layer is present on the sidewalls of the gate structure.

5. The method of claim 1, wherein the converting of the upper surface of the metal semiconductor alloy to the oxygen-containing protective layer comprises a thermal oxidation, a plasma oxidation, a wet clean of a oxygenating species or a combination thereof.

6. The method of claim 5, wherein the at least one gate conductor comprises a silicon-containing gate conductor, the oxygen-containing protective layer comprises silicon oxide, the thermal oxidation comprises a thermal anneal at a temperature greater than 400° C. in an atmosphere comprising 5% to 100% oxygen ($O_2$).

7. The method of claim 5, wherein the at least one gate conductor comprises a silicon-containing gate conductor, the oxygen-containing protective layer comprises silicon oxide, the plasma oxidation comprises an ozone-containing plasma.

8. The method of claim 5, wherein the at least one gate conductor comprises a silicon-containing gate conductor, the oxygen-containing protective layer comprises silicon oxide, the wet clean comprises deionized water comprising an ozone source.

9. The method of claim 5, wherein the oxygen-containing protective layer has a thickness ranging from 15 Angstroms to 50 Angstroms.

10. The method of claim 1, wherein the removing the sidewall spacers comprises an isotropic or anisotropic etch process.

11. The method of claim 10, wherein the sidewall spacers comprises silicon nitride.

12. The method of claim 1, wherein the strain-inducing layer produces a tensile strain and the semiconductor device is an n-type conductivity semiconductor device, or the strain-inducing layer produces a compressive strain and the semiconductor device is a p-type conductivity semiconductor device.

13. A method of forming a semiconductor device comprising:
providing a gate structure including at least one gate conductor on a semiconductor substrate;
forming sidewall spacers adjacent to the gate structure;
forming a metal semiconductor alloy on at least one of an upper surface of the gate structure and exposed portions of the semiconductor substrate using at least a two stage annealing process, wherein a first stage of the annealing process of the two stage annealing process produces a metal semiconductor layer that is in direct contact with the at least one gate conductor and the exposed portion of the semiconductor substrate, and a second stage of the two stage annealing process forms a protective oxide region on the metal semiconductor layer;
removing the sidewall spacers using an etch that is selective to the oxygen-containing protective layer; and
forming a strain-inducing layer over the gate structure and the semiconductor surface, in which at least a portion of the strain-inducing layer is in direct contact with the sidewall surface of the at least one gate conductor.

14. The method of claim 13, wherein the second stage of the two stage annealing process includes an oxidizing ambient, and the first stage of the two stage annealing process includes a substantially oxygen free ambient.

15. The method of claim 14, wherein the temperature of the two stage annealing process ranges from 350° C. to 600° C. for a time period ranging from about 1 second to about 90 seconds.

16. A method of forming a complementary metal oxide semiconductor (CMOS) device comprising:
providing a semiconductor substrate having a first gate structure in an n-type device region of the semiconductor substrate, and a second gate structure in a p-type device region of the semiconductor substrate; forming metal semiconductor alloy regions atop at least one of the first and second gate structures and a portion of the semiconductor substrate adjacent to the first and second gate structures;
converting an upper surface of the metal semiconductor alloy regions to an oxygen-containing protective layer;
forming a strain-inducing layer on the semiconductor substrate in the n-type device region, the semiconductor substrate in the p-type device region and over the first gate structure and second gate structure; and
removing the strain-inducing layer from the p-type device region with an etch that is selective to the oxygen-containing protective layer, wherein a remaining portion of the strain-inducing layer is in the n-type device region.

17. The method of claim 16, wherein the converting of the upper surface of the metal semiconductor alloy to the oxygen-containing protective layer comprises a thermal oxidation, a plasma oxidation, a rinse of a oxygenating species or a combination thereof.

18. The method of claim 17, wherein the at least one gate conductor comprises a silicon-containing gate conductor, the oxygen-containing protective layer comprises silicon oxide, the thermal oxidation comprises a thermal anneal at a temperature greater than 400° C. in an atmosphere comprising 5% to 100% oxygen ($O_2$).

19. The method of claim 17, wherein the at least one gate conductor comprises a silicon-containing gate conductor, the oxygen-containing protective layer comprises silicon oxide, the plasma oxidation comprises an ozone-containing plasma.

20. The method of claim 17, wherein the at least one gate conductor comprises a silicon-containing gate conductor, the oxygen-containing protective layer comprises silicon oxide, the rinse comprises deionized water comprising an ozone source.

21. The method of claim 16, further comprising forming sidewall spacers composed of a nitride containing material adjacent to the first gate structure and adjacent to the second gate structure, wherein the converting of the upper surface of the metal semiconductor alloy regions to the oxygen-containing protective layer forms an oxygen-containing surface on an exterior surface of the nitride containing material of the sidewall spacers.

22. The method of claim 16, wherein the etch for the removing of the strain-inducing layer from the p-type device region that is selective to the oxygen-containing protective layer is also selective to the oxygen-containing surface that is on the exterior surface of the nitride containing material of the sidewall spacers.

23. The method of claim 16, further comprising forming sidewall spacers adjacent to the first gate structure and adjacent to the second gate structure and forming source and drain regions within the n-type device region and the p-type device region before the forming of the metal semiconductor alloy regions; and removing the sidewall spacers using a first etch that is selective to the oxygen-containing protective layer.

* * * * *